(12) United States Patent
Nakajima et al.

(10) Patent No.: US 8,530,041 B2
(45) Date of Patent: Sep. 10, 2013

(54) TRANSPARENT CONDUCTIVE FILM AND TOUCH PANEL

(75) Inventors: Kazuhiro Nakajima, Ibaraki (JP); Tomotake Nashiki, Ibaraki (JP); Hideo Sugawara, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 943 days.

(21) Appl. No.: 12/502,288

(22) Filed: Jul. 14, 2009

(65) Prior Publication Data

US 2010/0015417 A1    Jan. 21, 2010

(30) Foreign Application Priority Data

Jul. 16, 2008 (JP) ................................. 2008-185160

(51) Int. Cl.
*B32B 3/00* (2006.01)

(52) U.S. Cl.
USPC ......... 428/195.1; 428/212; 428/215; 428/216

(58) Field of Classification Search
USPC ...... 428/195.1, 212, 213, 215, 216; 345/173, 345/174
See application file for complete search history.

(56) References Cited

U.S. PATENT DOCUMENTS

| 7,914,883 B2 * | 3/2011 | Noguchi et al. | 428/220 |
| 7,968,185 B1 * | 6/2011 | Noguchi et al. | 428/332 |
| 2006/0290409 A1 * | 12/2006 | Noguchi et al. | 327/517 |
| 2007/0236618 A1 | 10/2007 | Maag et al. | |
| 2008/0138589 A1 | 6/2008 | Wakabayashi et al. | |

FOREIGN PATENT DOCUMENTS

| JP | 04154647 A | * | 5/1992 |
| JP | 2003173238 A | * | 6/2003 |
| JP | 2004152727 A | * | 5/2004 |
| JP | 2008-098169 A | | 4/2008 |
| WO | WO 2006126604 A1 | * | 11/2006 |

OTHER PUBLICATIONS

Machine translation of JP 2004-152727 acquired on Jun. 1, 2012.*
Machine translation of JP 2003-173238 acquired on Jun. 1, 2012.*
"Index of Refraction of Inorganic Crystals" in CRC Handbook of Chemistry and Physics, 92nd Ed. 2011, p. 10-239 to 10-242. Acquired from http://www.hbcpnetbase.com/ on Jun. 1, 2012.*

* cited by examiner

*Primary Examiner* — Gerard Higgins
(74) *Attorney, Agent, or Firm* — Westerman, Hattori, Daniels & Adrian, LLP

(57) ABSTRACT

The transparent conductive film of the present invention is a transparent conductive film, comprising a transparent film substrate, and a first transparent dielectric layer, a second transparent dielectric layer and a patterned transparent conductive layer that are formed on one or both sides of the transparent film substrate in this order from the transparent film substrate side, wherein the transparent conductive layer has a thickness of 31 nm or more, the first transparent dielectric layer has a thickness of from 7 nm to 16 nm, the second transparent dielectric layer has a thickness of from 30 nm to 60 nm, and the relation $n2<n3 \leq n1$ is satisfied, wherein $n1$ is the refractive index of the first transparent dielectric layer, $n2$ is the refractive index of the second transparent dielectric layer, and $n3$ is the refractive index of the transparent conductive layer.

5 Claims, 4 Drawing Sheets

TRANSPARENT CONDUCTIVE FILM AND TOUCH PANEL

BACKGROUND OF THE INVENTION

1. Field of the Invention

The invention relates to a transparent conductive film and a touch panel therewith.

2. Description of the Related Art

Concerning conventional transparent conductive components, the so-called conductive glass is well known, which includes a glass member and an indium oxide thin film formed thereon. Since the base member of the conductive glass is made of glass, however, it has low flexibility or workability and cannot preferably be used in some applications. In recent years, therefore, transparent conductive films using various types of plastic films such as polyethylene terephthalate films as their substrates have been used, because of their advantages such as good impact resistance and light weight as well as flexibility and workability.

A known transparent conductive film for detecting input positions includes a transparent conductive layer having a predetermined pattern. However, such a patterned transparent conductive layer may produce a clear difference between the patterned portion and the non-patterned portion (pattern opening portion) so that a display device produced therewith may have a poor appearance. Particularly concerning capacitive touch panels having a patterned transparent conductive layer over the surface of the display unit, there has been a demand for a technique that can provide a good appearance to display devices even when transparent conductive layers are patterned.

In order to improve the appearance produced with a patterned transparent conductive layer, for example, Japanese Patent Application Laid-Open (JP-A) No. 2008-98169 proposes a transparent conductive film including a transparent film substrate, a transparent conductive layer with a thickness of 30 nm or less and two undercoat layers different in refractive index placed between the transparent film substrate and the transparent conductive layer. The publication also discloses an example of such a transparent conductive film that includes a transparent film substrate, and a high-refractive-index silicon-tin oxide layer with a refractive index of 1.7 (10 nm or more in thickness), a low-refractive-index silicon oxide layer with a refractive index of 1.43 (30 nm in thickness) and an ITO film with a refractive index of 1.95 (15 nm in thickness) as a transparent conductive layer, which are formed in this order on the transparent film substrate.

SUMMARY OF THE INVENTION

In the transparent conductive film described in Japanese Patent Application Laid-Open (JP-A) No. 2008-98169, however, the difference between the pattern portion and the pattern opening portion may be clear in some cases, and therefore, it is still insufficient to improve the appearance.

In recent years, touch panels have been required to have high detection accuracy, and, therefore, a reduction in the pattern width of transparent conductive layers has been studied. It has also been required to ensure that transparent conductive layers have a given resistance necessary for touch panel driving. Under the circumstances, when a thin transparent conductive layer with a thickness of 30 nm or less is used in a transparent conductive film as described in Japanese Patent Application Laid-Open (JP-A) No. 2008-98169, a reduction in the pattern width of the transparent conductive layer may make it impossible to ensure the given resistance.

The invention is to provide a transparent conductive film having a patterned transparent conductive layer, which can achieve a low resistance even when the pattern width of the transparent conductive layer is reduced and which is reduced in the difference between the pattern portion and the pattern opening portion and has a good appearance. The invention is also to provide a touch panel using such a transparent conductive film.

The transparent conductive film of the present invention is a transparent conductive film, comprising a transparent film substrate, and a first transparent dielectric layer, a second transparent dielectric layer and a patterned transparent conductive layer that are formed on one or both sides of the transparent film substrate in this order from the transparent film substrate side, wherein the transparent conductive layer has a thickness of 31 nm or more, the first transparent dielectric layer has a thickness of from 7 nm to 16 nm, the second transparent dielectric layer has a thickness of from 30 nm to 60 nm, and the relation $n2<n3\leq n1$ is satisfied, wherein $n1$ is the refractive index of the first transparent dielectric layer, $n2$ is the refractive index of the second transparent dielectric layer, and $n3$ is the refractive index of the transparent conductive layer.

In the transparent conductive film of the invention, the transparent conductive layer has a thickness of 31 nm or more so that a low resistance can be achieved even when the pattern width is reduced. The thickness of each layer in the above range and the relation $n2<n3\leq n1$ between the refractive indices of the respective layers make it possible to reduce the difference in reflectance between the pattern portion and the portion immediately below the pattern opening portion. Since the difference between the pattern portion and the pattern opening portion is reduced, therefore, a transparent conductive film with a good appearance is provided. In an embodiment of the invention, the refractive index is determined for light at a wavelength of 589.3 nm.

In the above, it is preferable that $n1$ is from 1.90 to 2.40, $n2$ is from 1.40 to 1.90, and $n3$ is from 1.90 to 2.10. In the above range, the difference in reflectance between the pattern portion and the portion immediately below the pattern opening portion can be effectively reduced.

In the above, it is preferable that $n1$ minus $n2$ is from 0.3 to 0.9. According to this feature, the difference in reflectance between the pattern portion and the portion immediately below the pattern opening portion can be more effectively reduced.

In the above, it is preferable that the transparent film substrate has a thickness of from 2 μm to 200 μm. According to this feature, a relatively thin film can be easily produced, while a certain mechanical strength can be ensured.

The transparent film substrate preferably has a refractive index of from 1.50 to 1.70, so that the difference in reflectance between the pattern portion and the portion immediately below the pattern opening portion can be more effectively reduced.

The transparent conductive film of the invention is suitable for use in touch panels based on various detection methods (such as capacitive types and resistive film types) and particularly suitable for use in capacitive touch panels. Capacitive touch panels have a patterned transparent conductive layer formed over the surface of the display unit. In such capacitive tough panels, therefore, the function according to the invention (the function of reducing the difference in reflectance between the pattern portion and the portion immediately below the pattern opening portion) is more effectively performed.

The invention is also directed to a touch panel including the transparent conductive film of the invention stated above. The touch panel of the invention can produce the same advantageous effect as the transparent conductive film of the invention.

DETAILED DESCRIPTION OF THE PREFERRED EMBODIMENTS

Figure 1:
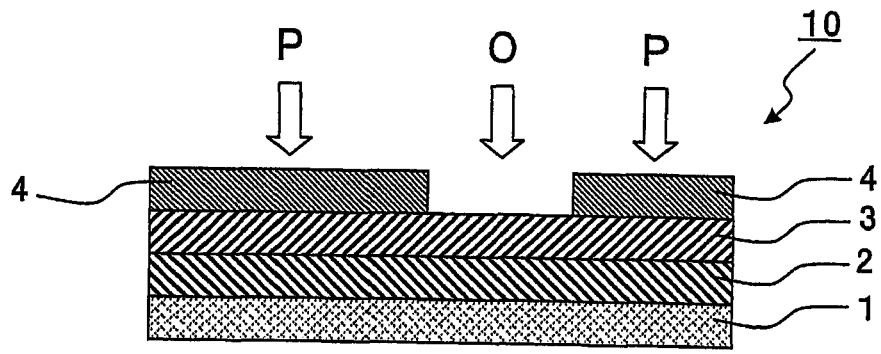
FIG. 1 is a cross-sectional view of a transparent conductive film according to a first embodiment of the invention.

Embodiments of the invention are described below with reference to the drawings. In the drawings, the same elements are represented by the same reference characters, and undue duplication of the description will be avoided.

First Embodiment

FIG. 1 is a cross-sectional view of a transparent conductive film according to a first embodiment of the invention. Referring to FIG. 1, the transparent conductive film 10 includes a transparent film substrate 1 and a first transparent dielectric layer 2, a second transparent dielectric layer 3 and a transparent conductive layer 4 that are sequentially formed on one side of the transparent film substrate 1. The transparent conductive layer 4 is patterned to form a pattern portion P and a pattern opening portion O.

The transparent conductive film 10 satisfies the relation $n2<n3 \leq n1$, wherein n1, n2 and n3 are the refractive indices of the first transparent dielectric layer 2, the second transparent dielectric layer 3 and the transparent conductive layer 4, respectively. The transparent conductive layer 4 has a thickness of 31 nm or more (preferably 35 nm or more). The first transparent dielectric layer 2 has a thickness of from 7 to 16 nm (preferably from 9 to 15 nm). The second transparent dielectric layer 3 has a thickness of from 30 to 60 nm (preferably from 35 to 55 nm). These features reduce the difference in reflectance between the pattern portion P and the portion immediately below the pattern opening portion O. Since the difference between the pattern portion P and the pattern opening portion O is reduced, there is provided a transparent conductive film having a good appearance. In addition, the transparent conductive layer 4 of the transparent conductive film 10 has a thickness of 31 nm or more so that a low resistance can be achieved even when the pattern width is reduced. The thickness of the transparent conductive layer 4 is preferably 60 nm or less, more preferably 50 nm or less, in view of transparency.

There is no particular limitation to the transparent film substrate 1, and various types of plastic films having transparency may be used. Examples of the material for the transparent film substrate 1 include polyester resins, acetate resins, polyethersulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins. In particular, polyester resins, polycarbonate resins, and polyolefin resins are preferred.

Examples thereof also include polymer films as disclosed in JP-A No. 2001-343529 (WO01/37007) and a resin composition that contains a thermoplastic resin having a side chain of a substituted and/or unsubstituted imide group and a thermoplastic resin having a side chain of substituted and/or unsubstituted phenyl and nitrile groups. Specifically, a polymer film of a resin composition containing an alternating copolymer made of isobutylene and N-methylmaleimide, and an acrylonitrile-styrene copolymer may be used.

The transparent film substrate 1 preferably has a thickness of from 2 to 200 μm, more preferably from 2 to 100 μm. In this range, a relatively thin film can be easily produced, while a certain mechanical strength can be ensured.

The transparent film substrate 1 preferably has a refractive index of from 1.50 to 1.70, more preferably from 1.53 to 1.70. In this case, the difference in reflectance between the pattern portion P and the portion immediately below the pattern opening portion O can be more effectively reduced.

The surface of the transparent film substrate 1 may be previously subject to sputtering, corona discharge treatment, flame treatment, ultraviolet irradiation, electron beam irradiation, chemical treatment, etching treatment such as oxidation, or undercoating treatment such that the adhesion of the first transparent dielectric layer 2 formed thereon to the transparent film substrate 1 can be improved. If necessary, the transparent film substrate 1 may also be subjected to dust removing or cleaning by solvent cleaning, ultrasonic cleaning or the like, before the first transparent dielectric layer 2 is formed.

The first and second transparent dielectric layers 2 and 3 may each be made of an inorganic material, an organic material or a mixture of an inorganic material and an organic material. Examples of the inorganic material include $LaF_3$ (1.55), $CeF_3$ (1.63), $Al_2O_3$ (1.63), and $TiO_2$ (2.35), wherein each number inside the parentheses is the refractive index of each material. Besides the above, a complex oxide containing at least indium oxide and cerium oxide may also be used. Examples of the organic material include acrylic resins, urethane resins, melamine resins, alkyd resins, siloxane polymers, organosilane condensates, or any mixture thereof.

In particular, the first transparent dielectric layer 2 is preferably made of a complex oxide containing at least indium oxide and cerium oxide. In this case, a high refractive index equal to or higher than that of the transparent conductive layer 4 can be achieved so that optical control can be easily performed. In addition, when the first transparent dielectric layer 2 is produced by a dry process such as a sputtering method using the complex oxide as a raw material, a relatively high deposition rate can be used so that the productivity can be improved.

In particular, the complex oxide is preferably one containing 100 parts by weight of indium oxide, 0 to 20 parts by weight of tin oxide, and 10 to 60 parts by weight of cerium oxide. In this case, a high refractive index equal to or higher than that of the transparent conductive layer can be readily achieved. The material used to form the complex oxide is preferably a sintered mixture of the respective oxide components. In view of optical properties, the content of tin oxide in the complex oxide is preferably from 3 to 15 parts by weight, based on 100 parts by weight of indium oxide. The cerium oxide content is preferably from more than 40 to 60 parts by weight (in particular preferably from more than 40 to 50 parts by weight) based on 100 parts by weight of indium oxide, so that the first transparent dielectric layer 2 can have a higher refractive index, which makes it easier to achieve a high refractive index equal to or higher than that of the transparent conductive layer 4. This feature can effectively reduce the difference in reflectance between the pattern portion P and the portion immediately below the pattern opening portion O.

The first and second transparent dielectric layers 2 and 3 provided between the transparent film substrate 1 and the transparent conductive layer 4 do not function as conductive layers. In other words, the first and second transparent dielectric layers 2 and 3 are provided as dielectric layers capable of insulating pattern portions P of the transparent conductive layer 4 from one another. Therefore, the first and second transparent dielectric layers 2 and 3 each typically have a surface resistance of $1 \times 10^6$ Ω/square or more, preferably $1 \times 10^7$ Ω/square or more, more preferably $1 \times 10^8$ Ω/square or more. The surface resistance of the first and second transparent dielectric layers 2 and 3 does not have any particular upper limit. While the surface resistance of the first and second transparent dielectric layers 2 and 3 may generally has an upper limit of about $1 \times 10^{13}$ Ω/square, which corresponds to a measuring limit, it may be higher than $1 \times 10^{13}$ Ω/square.

Examples of materials that may be used to form the transparent conductive layer 4 include, but are not limited to, oxides of at least one metal (or semimetal) selected from the group consisting of indium, tin, zinc, gallium, antimony, titanium, silicon, zirconium, magnesium, aluminum, gold, silver, copper, palladium, and tungsten. Such oxides may be optionally added with any metal atom selected from the above group or any oxide thereof. For example, indium oxide containing with tin oxide or tin oxide containing with antimony is preferably used.

The surface resistance of the transparent conductive layer 4 is generally in the range of from 30 to 1,000 Ω/square, preferably from 30 to 500 Ω/square in terms of improving detection accuracy, while it may be appropriately determined depending on the material to be used and the pattern width.

The refractive index (n1) of the first transparent dielectric layer 2 is preferably from 1.90 to 2.40 (more preferably from 2.10 to 2.30). The refractive index (n2) of the second transparent dielectric layer 3 is preferably from 1.40 to 1.90 (more preferably from 1.40 to 1.75). The refractive index (n3) of the transparent conductive layer 4 is preferably from 1.90 to 2.10 (more preferably from 1.95 to 2.05). When each layer has a refractive index in the above range, the difference in reflectance between the pattern portion P and the portion immediately below the pattern opening portion O can be effectively reduced, while transparency can be ensured.

An illustrative method for producing the transparent conductive film 10 typically includes the steps of forming the first transparent dielectric layer 2, the second transparent dielectric layer 3 and the transparent conductive layer 4 on one side of the transparent film substrate 1 in this order from the transparent film substrate 1 side and patterning the transparent conductive layer 4 by etching with acid.

Examples of methods for forming each of the first transparent dielectric layer 2, the second transparent dielectric layer 3, and the transparent conductive layer 4 include a vacuum deposition method, a sputtering method, an ion plating method, and so on. Among these methods, sputtering methods are generally used, while any appropriate method may be used depending on the type of the material and the desired thickness. In addition, coating methods may also be used to form the second transparent dielectric layer 3.

In the etching, the transparent conductive layer 4 may be covered with a patterning mask and etched with an acid. The acid may be an inorganic acid such as hydrochloric acid, hydrobromic acid, sulfuric acid, nitric acid, or phosphoric acid, an organic acid such as acetic acid, any mixture thereof, or an aqueous solution of any of the foregoing.

After the transparent conductive layer 4 is patterned, if necessary, the patterned transparent conductive layer 4 may be subjected to heat treatment. In this case, the component of the transparent conductive layer 4 can be crystallized so that the transparency and the conductivity can be improved. In this treatment, the heating temperature is typically in the range of from 100 to 180° C., and the treatment time is typically in the range of from 15 to 180 minutes.

The transparent conductive layer 4 may be patterned in any of various forms such as stripes depending on the intended use of the transparent conductive film 10.

Second Embodiment

Figure 2:
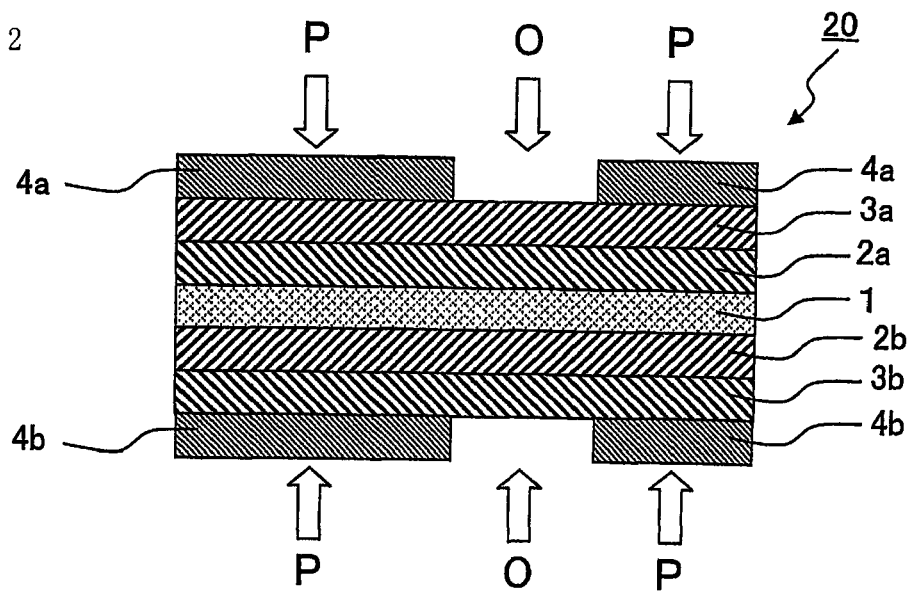
FIG. 2 is a cross-sectional view of a transparent conductive film according to a second embodiment of the invention.

Next, a description is given of a transparent conductive film according to a second embodiment of the invention. FIG. 2 is a cross-sectional view of the transparent conductive film according to the second embodiment of the invention. Referring to FIG. 2, the transparent conductive film 20 includes a transparent film substrate 1 and a first transparent dielectric layer 2a, a second transparent dielectric layer 3a and a transparent conductive layer 4a that are sequentially formed on the upper side of the transparent film substrate 1, and another first transparent dielectric layer 2b, another second transparent dielectric layer 3b and another transparent conductive layer 4b that are sequentially formed on the lower side of the transparent film substrate 1. The transparent conductive layers 4a and 4b are each patterned to form a pattern portion P and a pattern opening portion O.

The transparent conductive film 20 satisfies the relation $n2a < n3a \leqq n1a$, wherein $n1a$, $n2a$ and $n3a$ are the refractive indices of the first transparent dielectric layer 2a, the second transparent dielectric layer 3a and the transparent conductive layer 4a, respectively. The transparent conductive layer 4a has a thickness of 31 nm or more (preferably 35 nm or more). The first transparent dielectric layer 2a has a thickness of from 7 to 16 nm (preferably from 9 to 15 nm). The second transparent dielectric layer 3a has a thickness of from 30 to 60 nm (preferably from 35 to 55 nm). In addition, the transparent conductive film 20 satisfies the relation $n2b < n3b \leqq n1b$, wherein $n1b$, $n2b$ and $n3b$ are the refractive indices of the first transparent dielectric layer 2b, the second transparent dielectric layer 3b and the transparent conductive layer 4b, respectively. The transparent conductive layer 4b has a thickness of 31 nm or more (preferably 35 nm or more). The first transparent dielectric layer 2b has a thickness of from 7 to 16 nm (preferably from 9 to 15 nm). The second transparent dielectric layer 3b has a thickness of from 30 to 60 nm (preferably from 35 to 55 nm). These features produce the same effect as those of the transparent conductive film 10 described above produce.

Each of the first transparent dielectric layers 2a and 2b, each of the second transparent dielectric layers 3a and 3b, and each of the transparent conductive layers 4a and 4b to be used may be the same as the first transparent dielectric layer 2, the second transparent dielectric layer 3 and the transparent conductive layer 4 of the above transparent conductive film 10, respectively. The first transparent dielectric layers 2a and 2b may be made of the same or different materials and may have the same or different thicknesses. This may apply to the second transparent dielectric layers 3a and 3b or the transparent conductive layers 4a and 4b. The transparent conductive film 20 may be produced using the above method of producing the transparent conductive film 10, except that each layer is formed on both sides of the transparent film substrate 1.

When the transparent conductive layers 4a and 4b are formed on both sides of the transparent film substrate 1 as shown in FIG. 2, the portion immediately below the pattern opening portion O is provided for each of the transparent conductive layers 4a and 4b. In the transparent conductive film 20 of FIG. 2, each of the pattern portion P and the pattern opening portion O of the transparent conductive layer 4a coincides with each of the pattern portion P and the pattern opening portion O of the transparent conductive layer 4b. However, these portions do not have to coincide with each other, and both sides may be differently patterned as needed. This may apply to the drawings described below.

Third Embodiment

Figure 3:
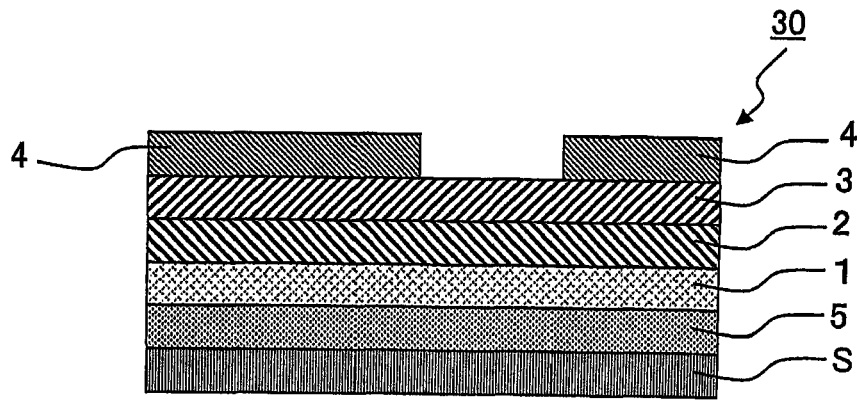
FIG. 3 is a cross-sectional view of a transparent conductive film according to a third embodiment of the invention.

Next, a description is given of a transparent conductive film according to a third embodiment of the invention. FIG. 3 is a cross-sectional view of the transparent conductive film according to the third embodiment of the invention. Referring to FIG. 3, the transparent conductive film 30 includes the structure of the transparent conductive film 10 described above and a separator S placed on the lower side of the transparent film substrate 1 with a transparent pressure-sensitive adhesive layer 5 interposed therebetween.

Any transparent pressure-sensitive adhesive may be used for the transparent pressure-sensitive adhesive layer 5 without limitation. For example, the pressure-sensitive adhesive may be appropriately selected from transparent adhesives based on polymers such as acrylic polymers, silicone polymers, polyester, polyurethane, polyamide, polyvinyl ether, vinyl acetate-vinyl chloride copolymers, modified polyolefins, epoxy polymers, fluoropolymers, and rubbers such as natural rubbers and synthetic rubbers. In particular, acrylic pressure-sensitive adhesives are preferably used, because they have good optical transparency and good weather or heat resistance and exhibit suitable wettability and adhesion properties such as cohesiveness and adhesiveness.

The transparent pressure-sensitive adhesive layer 5 is generally made from a pressure-sensitive adhesive solution (with a solids content of about 10 to about 50% by weight) containing a base polymer or a composition thereof dissolved or dispersed in a solvent. The solvent to be used may be appropriately selected from an organic solvent such as toluene or ethyl acetate or water or the like depending on the type of the pressure-sensitive adhesive.

The transparent conductive film 30 has the separator S. Therefore, the transparent pressure-sensitive adhesive layer 5 may be transferred and bonded to the desired surface, after the separator S is removed. For example, the separator S to be used preferably includes a polyester film or the like and a migration-preventing layer and/or a release layer placed thereon on the transparent pressure-sensitive adhesive layer 5 side.

The total thickness of the separator S is preferably 30 μm or more, more preferably from 60 to 100 μm. This is to prevent deformation of the transparent pressure-sensitive adhesive layer 5 (dents) in a case where the separator S is placed on the transparent pressure-sensitive adhesive layer 5 and then stored in the form of a roll, in which the deformation (dents) would be expected to occur due to foreign particles or the like intruding between portions of the rolled layer.

The migration-preventing layer may be made of an appropriate material for preventing migration of migrant components in the polyester film, particularly for preventing migration of low molecular weight oligomer components in the polyester. An inorganic or organic material or a composite of inorganic and organic materials may be used as a material for forming the migration-preventing layer. The thickness of the migration-preventing layer may be set in the range of 0.01 to 20 μm as needed. The migration-preventing layer may be formed by any method such as coating, spraying, spin coating, and in-line coating. Vacuum deposition, sputtering, ion plating, spray thermal decomposition, chemical plating, electroplating, or the like may also be used.

The release layer may be made of an appropriate release agent such as a silicone release agent, a long-chain alkyl release agent, a fluorochemical release agent, and a molybdenum sulfide release agent. The thickness of the release layer may be set as appropriate in view of the release effect. In general, the thickness is preferably 20 μm or less, more preferably in the range of 0.01 to 10 μm, particularly preferably in the range of 0.1 to 5 μm, in view of handleability such as flexibility. A production method of the release layer is not particularly limited, and may be formed in the same manner as in the case of the migration-preventing layer.

Fourth Embodiment

Figure 4:
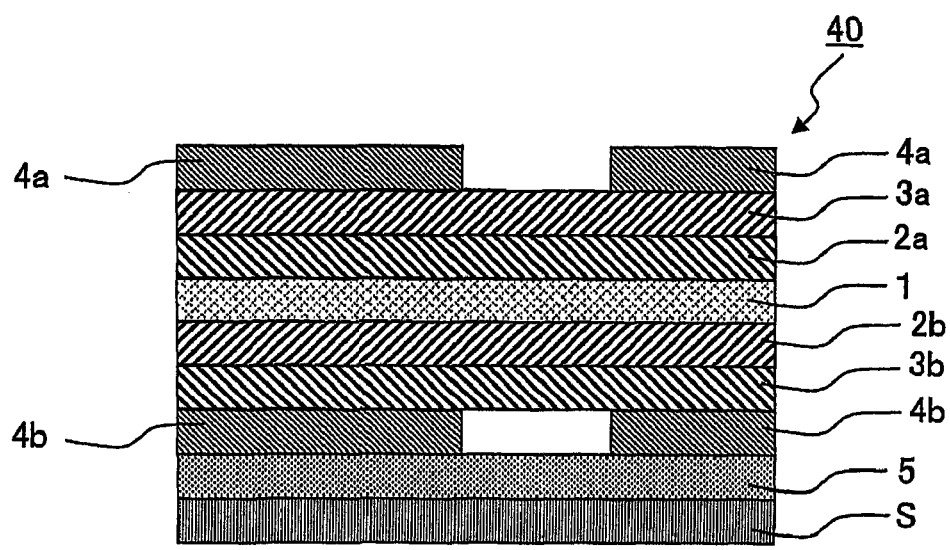
FIG. 4 is a cross-sectional view of a transparent conductive film according to a fourth embodiment of the invention.

Next, a description is given of a transparent conductive film according to a fourth embodiment of the invention. FIG. 4 is a cross-sectional view of the transparent conductive film according to the fourth embodiment of the invention. Referring to FIG. 4, the transparent conductive film 40 includes the structure of the transparent conductive film 20 described above and a separator S placed on the transparent conductive layer 4b on the lower side of the drawing with a transparent pressure-sensitive adhesive layer 5 interposed therebetween. This structure produces the same advantageous effect as the transparent conductive film 20 or 30 described above.

Fifth Embodiment

Figure 5:
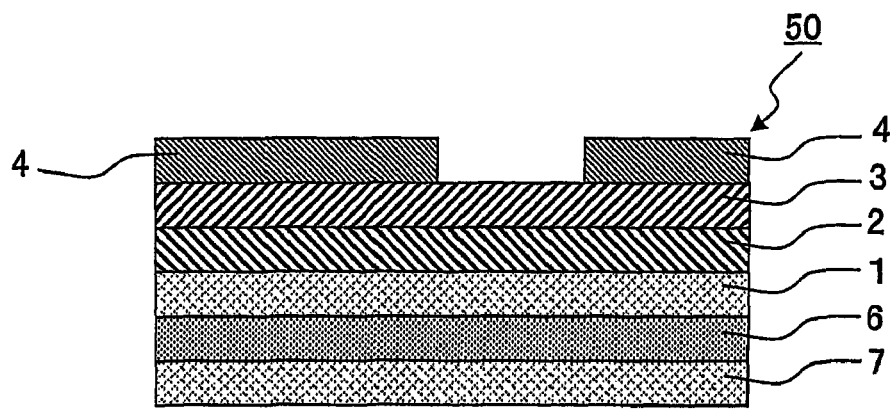
FIG. 5 is a cross-sectional view of a transparent conductive film according to a fifth embodiment of the invention.

Next, a description is given of a transparent conductive film according to a fifth embodiment of the invention. FIG. 5 is a cross-sectional view of the transparent conductive film according to the fifth embodiment of the invention. Referring to FIG. 5, the transparent conductive film 50 includes the structure of the transparent conductive film 10 described above and a transparent substrate 7 placed on the lower side of the transparent film substrate 1 (namely, on the surface of the transparent film substrate 1 opposite to the first transparent dielectric layer 2) with a transparent pressure-sensitive adhesive layer 6 interposed therebetween. The transparent pressure-sensitive adhesive layer 6 may be made of the same material as the transparent pressure-sensitive adhesive layer 5 described above.

The transparent substrate 7 preferably has a thickness of from 10 to 300 μm, more preferably from 20 to 250 μm. When the transparent substrate 7 is formed of a plurality of substrate films, each substrate film preferably has a thickness of from 10 to 200 μm, more preferably from 20 to 150 μm. The transparent substrate 7 or the substrate film may be made of the same material as the transparent film substrate 1 described above.

The transparent substrate 7 may be bonded to the transparent film substrate 1 by a process including forming the transparent pressure-sensitive adhesive layer 6 on the transparent substrate 7 and then attaching the transparent film substrate 1 thereto or by a process including forming the transparent pressure-sensitive adhesive layer 6 contrarily on the transparent film substrate 1 and then attaching the transparent substrate 7 thereto. The latter process is more advantageous in terms of productivity, because it allows continuous formation of the transparent pressure-sensitive adhesive layer 6 on the transparent film substrate 1 used in the form of a roll. Alternatively, the transparent substrate 7 may be formed by sequentially laminating a plurality of substrate films with a transparent pressure-sensitive adhesive layer or layers (not shown) on the transparent film substrate 1. The transparent pressure-sensitive adhesive layer for use in laminating substrate films may be the same as the transparent pressure-sensitive adhesive layer 5 described above.

After the bonding of the transparent substrate 7, for example, the transparent pressure-sensitive adhesive layer 6 has a cushion effect and thus can function to improve the scratch resistance of the transparent conductive layer 4 formed on one side of the transparent film substrate 1 or to improve the tap properties thereof for touch panels, such as so called pen input durability and surface pressure durability. In terms of performing this function better, it is preferred that the elastic modulus of the transparent pressure-sensitive adhesive layer 6 is set in the range of 1 to 100 N/cm$^2$ and that its thickness is set at 1 μm or more, preferably in the range of 5 to 100 μm. If the thickness is as described above, the effect can be sufficiently produced, and the adhesion between the transparent substrate 7 and the transparent film substrate 1 can also be sufficient. Here, in other aspects, the elastic modulus and the thickness of the pressure-sensitive adhesive layer to be applied to the transparent conductive film may be the same as those described above.

The transparent substrate 7 bonded through the transparent pressure-sensitive adhesive layer 6 imparts good mechanical strength to the transparent film substrate 1 to improve the pen input durability or the contact pressure durability and contribute to the prevention of curling or the like. This embodiment provides an example where the transparent substrate 7 is bonded to the transparent film substrate 1 with the transparent pressure-sensitive adhesive layer 6 interposed therebetween. Alternatively, for example, the transparent substrate 7 may be formed by applying a transparent liquid resin to the transparent film substrate 1 and drying it.

If necessary, a hard coat layer (not shown) may also be formed on the outer surface of the transparent substrate 7 (the surface opposite to the transparent pressure-sensitive adhesive layer 6) in order to protect the outer surface. For example, the hard coat layer is preferably made of a cured resin film such as a melamine, urethane, alkyd, acrylic, or silicone resin film. The hard coat layer preferably has a thickness of from 0.1 to 30 μm in view of hardness and the prevention of cracking or curling.

Sixth Embodiment

Figure 6:
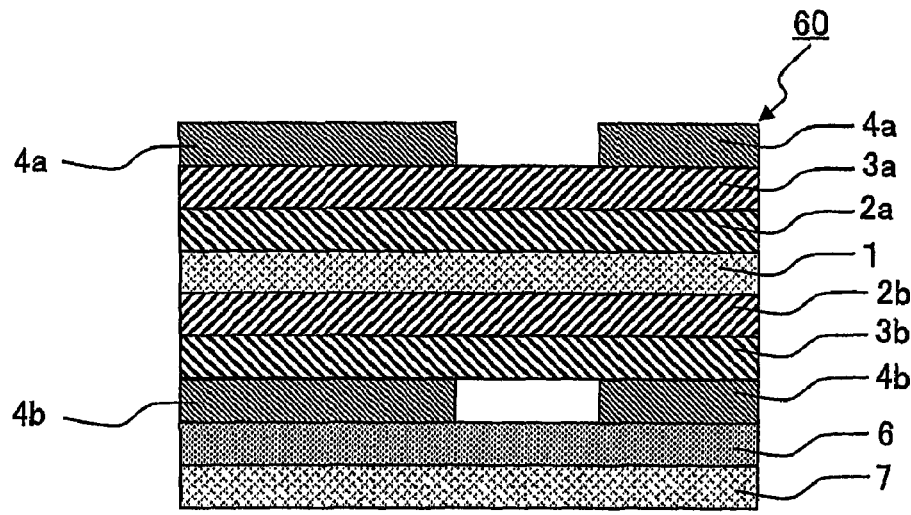
FIG. 6 is a cross-sectional view of a transparent conductive film according to a sixth embodiment of the invention.

Next, a description is given of a transparent conductive film according to a sixth embodiment of the invention. FIG. 6 is a cross-sectional view of the transparent conductive film according to the sixth embodiment of the invention. Referring to FIG. 6, the transparent conductive film 60 includes the structure of the transparent conductive film 20 described above and a transparent substrate 7 placed on the lower side of the transparent conductive layer 4*b* (namely, on the surface of the transparent conductive layer 4*b* opposite to the second transparent dielectric layer 3*b*) with a transparent pressure-sensitive adhesive layer 6 interposed therebetween. This structure produces the same advantageous effect as the transparent conductive film 20 or 50 described above.

While transparent conductive films according to some embodiments of the invention have been described above, the embodiments of the invention is not limited to those described above. For example, the second transparent dielectric layer may also be patterned. The transparent conductive film of the present invention may be provided with an antiglare layer or an antireflection layer for the purpose of increasing visibility. When the transparent conductive film is used for a resistive film type touch panel, an antiglare layer or an antireflection layer may be formed on the outer surface of the transparent substrate (on the side opposite to the pressure-sensitive adhesive layer) similarly to the hard coat layer. An antiglare layer or an antireflection layer may also be formed on the hard coat layer. On the other hand, when the transparent conductive film is used for a capacitive type touch panel, an antiglare layer or an antireflection layer may be formed on the transparent conductive layer.

For example, the material to be used to form the antiglare layer may be, but not limited to, an ionizing radiation-curable resin, a thermosetting resin, a thermoplastic resin, or the like. The thickness of the antiglare layer is preferably from 0.1 to 30 μm.

The antireflection layer may use titanium oxide, zirconium oxide, silicon oxide, magnesium fluoride, or the like. In order to produce a more significant antireflection function, a laminate of a titanium oxide layer(s) and a silicon oxide layer(s) is preferably used. Such a laminate is preferably a two-layer laminate comprising a high-refractive-index titanium oxide layer (refractive index: about 2.35), which is formed on the transparent substrate or the hard coat layer, and a low-refractive-index silicon oxide layer (refractive index: about 1.46), which is formed on the titanium oxide layer. Also preferred is a four-layer laminate which comprises the two-layer laminate and a titanium oxide layer and a silicon oxide layer formed in this order on the two-layer laminate. The antireflection layer of such a two- or four-layer laminate can evenly reduce reflection over the visible light wavelength range (380 to 780 nm).

Figure 7:
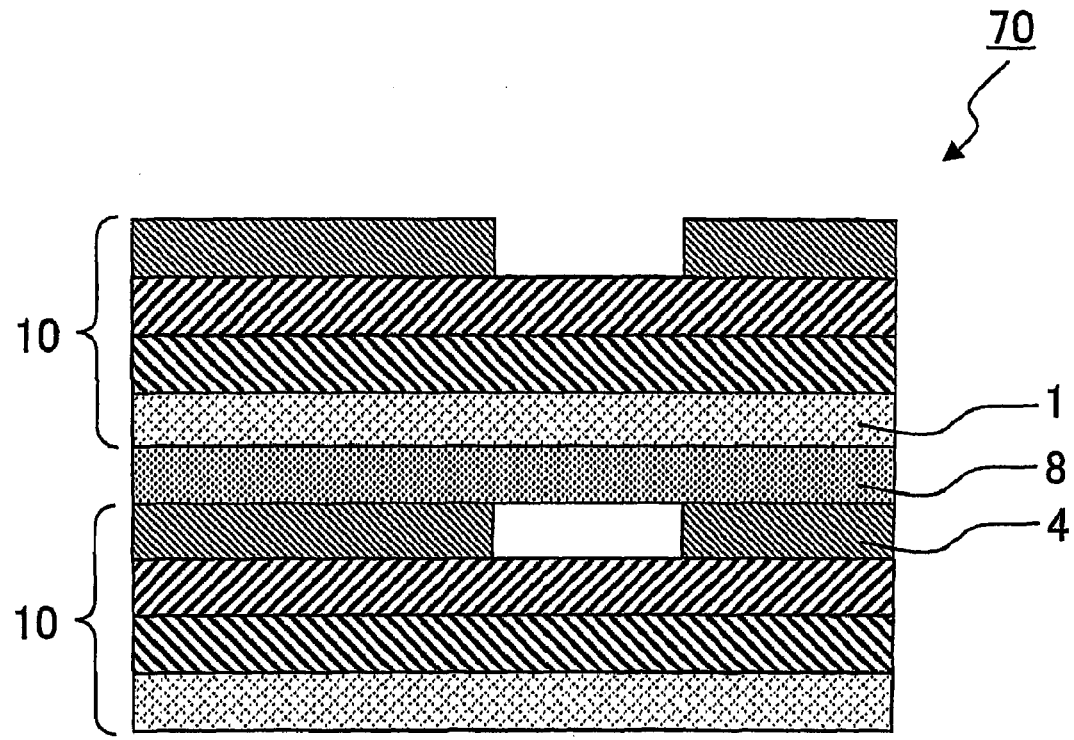
FIG. 7 is a cross-sectional view of a transparent conductive laminate which includes the transparent conductive film according to the first embodiment of the invention.

Next, a description is given of a transparent conductive laminate which includes the transparent conductive film of the invention. FIG. 7 is a cross-sectional view of the transparent conductive laminate includes the transparent conductive film 10 according to the first embodiment of the invention. Referring to FIG. 7, the transparent conductive laminate 70 includes two pieces of the transparent conductive film 10 described above that are laminated with a transparent pressure-sensitive adhesive layer 8 interposed therebetween. Specifically, two pieces of the transparent conductive film 10 are laminated in such a manner that the transparent film substrate 1 of the transparent conductive film 10 on one side is bonded to the transparent conductive layer 4 of the transparent conductive film 10 on the other side with the transparent pressure-sensitive adhesive layer 8 interposed therebetween. The transparent pressure-sensitive adhesive layer 8 may be made of the same material as the transparent pressure-sensitive adhesive layer 5 described above. The transparent conductive laminate 70 including two pieces of the transparent conductive film 10 makes it possible to detect locations along the X- and Y-axes on each transparent conductive film 10.

Seventh Embodiment

Figure 8:
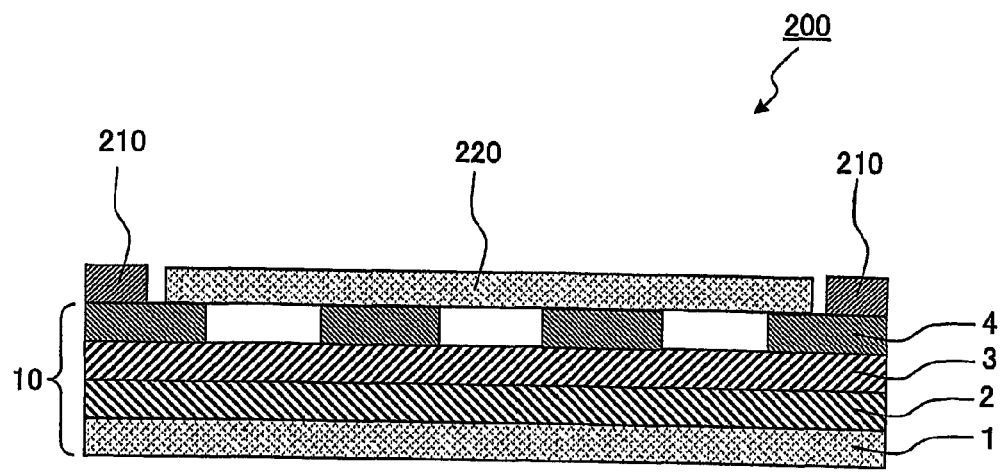
FIG. 8 is a schematic cross-sectional view of a capacitive touch panel according to a seventh embodiment of the invention.

Next, a description is given of a touch panel according to a seventh embodiment of the invention. FIG. 8 is a schematic cross-sectional view of a capacitive touch panel according to the seventh embodiment of the invention. Referring to FIG. 8, the touch panel 200 includes the transparent conductive film 10 described above, electrode terminals 210 arranged at a regular pitch on a peripheral portion of the transparent conductive layer 4 of the transparent conductive film 10, and a transparent protective layer 220 placed above the transparent conductive layer 4 and inside the electrode terminals 210. The transparent protective layer 220 may be made of the same material as the transparent film substrate 1 described above.

In the touch panel 200, the transparent conductive layer 4 is connected through the electrode terminals 210 to a touch location detection circuit (not shown) located on the outside. Therefore, when any point (coordinate) of the transparent protective layer 220 on the transparent conductive layer 4 is touched by a finger, the transparent conductive layer 4 is grounded at the touch point through the capacitance of the human body so that the resistance between each electrode terminal 210 and the ground line is changed. This change is detected by the touch location detection circuit so that the coordinate on the display screen (not shown) is input.

While an example of the touch panel of the invention has been described, the touch panel of the invention is not limited to that according to the embodiment described above, as long as the transparent conductive film of the invention or the transparent conductive laminate of the invention is used. For example, the touch panel of the invention may be of any other detection type such as a resistive film type.

EXAMPLES

Some examples of the invention are described below together with some comparative examples. It will be understood that the invention should not be interpreted as being limited to the examples described below.

Refractive Index of Each Layer

The refractive index of each layer was measured with an Abbe refractometer manufactured by Atago Co., Ltd. according to the measurement method specified for the refractometer, while a measurement light beam was applied to the surface of each object being measured.

Thickness of Each Layer

The thickness of the transparent film substrate was measured with a microgauge type thickness gauge manufactured by Mitutoyo Corporation. The thicknesses of other layers were measured by observing their cross-sections with a transmission electron microscope H-7650 manufactured by Hitachi, Ltd.

Example 1

Formation of First Transparent Dielectric Layer (First Layer)

A first transparent dielectric layer (12 nm in thickness) of a complex oxide (with a refractive index n1 of 2.20) containing 100 parts by weight of indium oxide, 3 parts by weight of tin oxide and 44 parts by weight of cerium oxide was formed by a reactive sputtering method under the conditions below in a mixed gas atmosphere of 95% argon gas and 5% oxygen gas from a sintered body of a mixture of 100 parts by weight of indium oxide, 3 parts by weight of tin oxide and 44 parts by weight of cerium oxide on one side of a transparent film substrate (with a refractive index nf of 1.65) made of a 23 μm-thick polyethylene terephthalate film (hereinafter referred to as PET film). Before the mixed gas was introduced into the atmosphere for the film production, gaseous impurities were removed by reducing the degree of vacuum of the atmosphere for the film production to $5.0 \times 10^{-4}$ Pa or less.

Sputtering Conditions
Target Size: 200 mm×500 mm
Power: 3.0 kW
Voltage: 450 V
Discharge Time: 1 minute
Degree of Vacuum: 0.5 Pa Formation of Second Transparent Dielectric Layer (Second Layer)

A 40 nm-thick second transparent dielectric layer (with a refractive index n2 of 1.54) was then formed on the first transparent dielectric layer by a process including applying a thermosetting resin composed of a melamine resin, an alkyd resin and an organosilane condensate (2:2:1 in weight ratio) to the first transparent dielectric layer and curing the resin.

Formation of Transparent Conductive Layer (Third Layer)

A 40 nm-thick ITO film (with a refractive index n3 of 2.00) was formed as a transparent conductive layer on the second transparent dielectric layer by a reactive sputtering method under a mixed gas atmosphere of 98% argon gas and 2% oxygen gas (0.4 Pa) using a sintered material of 97% by weight of indium oxide and 3% by weight of tin oxide.

Patterning of ITO Film by Etching

After a photoresist film having a stripe pattern was formed on the ITO film, the ITO film was etched by immersing it in a 5% by weight hydrochloric acid (aqueous hydrogen chloride solution) at 25° C. for 1 minute. The resulting ITO film had a pattern width of 5 mm and a pattern pitch of 1 mm.

Heat Treatment of Transparent Conductive Layer

The patterned ITO film was heat-treated at 140° C. (for 90 minutes) so that the component of the ITO film was crystallized. As a result, a transparent conductive film was obtained.

Example 2

A transparent conductive film having a patterned ITO film was obtained using the process of Example 1, except that the thickness of the first layer (the first transparent dielectric layer) was adjusted to the value shown in Table 1 and that the second layer (the second transparent dielectric layer) was formed by the method shown below.

Formation of Second Layer of Example 2

A resin composition was prepared by mixing $TiO_2$ (2.35 in refractive index) fine particles into a thermosetting resin composed of a melamine resin, an alkyd resin and an organosilane condensate (2:2:1 in weight ratio). In this process, the amount of the addition of the $TiO_2$ fine particles was controlled so that the resin composition could have a refractive index n2 of 1.70. The resin composition was applied to the first transparent dielectric layer and cured to form a 50 nm-thick second transparent dielectric layer.

Example 3

A transparent conductive film having a patterned ITO film was obtained using the process of Example 1, except that the thickness of the first layer (the first transparent dielectric layer) was adjusted to the value shown in Table 1.

Comparative Example 1

A transparent conductive film having a patterned ITO film was obtained using the process of Example 1, except that the first layer was made of the second layer material of Example 2, the thickness of the first layer was adjusted to the value shown in Table 1 and the second layer was formed by the method shown below.

Formation of Second Layer of Comparative Example 1

$SiO_2$ (with a refractive index n2 of 1.46) was vapor-deposited on the first layer at a degree of vacuum of $1\times10^{-2}$ to $3\times10^{-2}$ Pa by an electron-beam heating method to form a 20 nm-thick second layer.

Comparative Example 2 and 3

Transparent conductive films having a patterned ITO film were obtained using the process of Example 1, except that the thickness of each of the first layer (the first transparent dielectric layer) was adjusted to the value shown in Table 1.

Comparative Example 4 and 5

Transparent conductive films having a patterned ITO film were obtained using the process of Example 1, except that the thickness of each of the second layer (the second transparent dielectric layer) was adjusted to the value shown in Table 1.

Comparative Example 6

A transparent conductive film having a patterned ITO film was obtained using the process of Example 1, except that the first layer was made of the same material as the second layer of Example 2 and that the thickness of the second layer was adjusted to the value shown in Table 1.

The transparent conductive films (samples) of the examples and the comparative examples were evaluated as described below. The results are shown in Table 1.

Surface Resistance of Third Layer (Transparent Conductive Layer)

The surface resistance (0/square) of the third layer was measured using the two-terminal method.

Difference in Reflectance

Reflection spectra were measured at an incidence angle of 10° using a spectrophotometer U-4100 manufactured by Hitachi, Ltd. in a measurement mode with an integrating sphere, and the average reflectance of the pattern portion and the average reflectance of the portion immediately below the pattern opening portion were each calculated in the wavelength range of from 450 to 650 nm. The difference in reflectance between the pattern portion and the portion immediately below the pattern opening portion was calculated from these average reflectance values. A light-blocking layer was formed on the back side (the PET film side) of the transparent conductive film (sample) using a black spray paint, and the measurement was performed under such conditions that reflection from the back side of the sample and incidence of light from the back side were almost prevented.

Evaluation of Appearance

The sample was placed on a black board in such a manner that the transparent conductive layer faced upward, and the sample was visually evaluated. Cases where it was difficult to visually distinguish the pattern portion from the pattern opening portion were evaluated as "○" (good), and cases where it was possible to visually distinguish the pattern portion from the pattern opening portion were evaluated as "x" (poor).

TABLE 1

| | Thickness of each layer (nm) | | | Refractive index of each layer | | | Surface resistance of third layer ($\Omega/\square$) | Difference in reflectance (%) | Evaluation of appearance |
|---|---|---|---|---|---|---|---|---|---|
| | First layer | Second layer | Third layer | First layer | Second layer | Third layer | | | |
| Example 1 | 12 | 40 | 40 | 2.20 | 1.54 | 2.00 | 80 | 0.40 | ○ |
| Example 2 | 10 | 50 | 40 | 2.20 | 1.70 | 2.00 | 80 | 0.50 | ○ |
| Example 3 | 15 | 40 | 40 | 2.20 | 1.54 | 2.00 | 80 | 1.64 | ○ |
| Comparative Example 1 | 70 | 20 | 40 | 1.70 | 1.46 | 2.00 | 80 | 4.50 | X |
| Comparative Example 2 | 5 | 40 | 40 | 2.20 | 1.54 | 2.00 | 80 | 5.14 | X |
| Comparative Example 3 | 17 | 40 | 40 | 2.20 | 1.54 | 2.00 | 80 | 3.00 | X |
| Comparative Example 4 | 12 | 70 | 40 | 2.20 | 1.54 | 2.00 | 80 | 5.31 | X |
| Comparative Example 5 | 12 | 20 | 40 | 2.20 | 1.54 | 2.00 | 80 | 3.11 | X |
| Comparative Example 6 | 50 | 25 | 40 | 1.70 | 1.54 | 2.00 | 80 | 4.52 | X |

Table 1 shows that the transparent conductive films according to the invention have a good appearance even when the transparent conductive layer is patterned. The surface resistance of the transparent conductive layer (the third layer) was found to be a good value (80 Ω/square) in all of the examples and the comparative examples.

What is claimed is:

1. A capacitive touch panel comprising a transparent conductive film, the transparent conductive film comprising a transparent film substrate, and a first transparent dielectric layer, a second transparent dielectric layer and a patterned transparent conductive layer that are formed on at least one side of the transparent film substrate in this order from the at least one side of the transparent film substrate, wherein
    the transparent conductive layer has a thickness of 31 nm to 60 nm,
    the first transparent dielectric layer has a thickness of from 7 nm to 16 nm,
    the second transparent dielectric layer has a thickness of from 35 nm to 60 nm, and
    the relation n2<n3≦n1 is satisfied, wherein n1 is the refractive index of the first transparent dielectric layer, n2 is the refractive index of the second transparent dielectric layer, and n3 is the refractive index of the transparent conductive layer.

2. The capacitive touch panel of claim 1, wherein
    n1 is from 1.90 to 2.40,
    n2 is from 1.40 to 1.90, and
    n3 is from 1.90 to 2.10.

3. The capacitive touch panel of claim 1, wherein n1 minus n2 is from 0.3 to 0.9.

4. The capacitive touch panel of claim 1, wherein the transparent film substrate has a thickness of from 2 μm to 200 μm.

5. The capacitive touch panel of claim 1, wherein the transparent film substrate has a refractive index of from 1.50 to 1.70.

* * * * *